United States Patent [19]
Chiu

[11] Patent Number: 5,257,718
[45] Date of Patent: Nov. 2, 1993

[54] METHOD OF BENDING AND SOLDERING CORNERS OF A FOLDING PRINTED-CIRCUIT BOARD

[76] Inventor: Ming T. Chiu, 3F., No. 4, Alley 11, Lane 327, Sec, 2, Chung Shan Rd., Chung Ho City, Taipei Hsien, Taiwan

[21] Appl. No.: 37,908

[22] Filed: Mar. 26, 1993

[51] Int. Cl.⁵ .......................... H05K 3/00; H05K 1/18
[52] U.S. Cl. ................................ 228/179.1; 228/174; 361/751; 174/254; 174/86; 29/830
[58] Field of Search ...................... 228/141.1, 174, 179, 228/170, 173.1, 173.6; 361/397, 398, 414; 174/254, 86; 29/825, 830, 846, 882

[56] References Cited

U.S. PATENT DOCUMENTS 4,742,183 5/1988 Soloway et al. .................. 174/254

Primary Examiner—Samuel M. Heinrich
Attorney, Agent, or Firm—Pro-Techtor International

[57] ABSTRACT

A method of bending and soldering corners of a folding printed-circuit board in which holes are drilled on the printed-circuit board at points at where the circuits intersect the joints of segments of the folding printed-circuit board; V-shaped grooves are cut on the printed-circuit board along the joints of segments, permitting the printed-circuit board to be bent into a desired shape; and the drilled circuits are connected by soldering adequate amount of tin solder in the holes on the circuits.

3 Claims, 3 Drawing Sheets

B

METHOD OF BENDING AND SOLDERING CORNERS OF A FOLDING PRINTED-CIRCUIT BOARD

BACKGROUND OF THE INVENTION

The present invention relates to a method for bending and soldering corners of a folding printed-circuit board, more particularly to a bending and soldering method which may speed the production of folding printed-circuit boards while enhances the quality stability of the products and reduces the percentage of defective product.

Generally, the printed-circuit boards are in the form of flat sheet, allowing a plurality of electronic components to be assembled thereon. However, when there are too many circuits and components being soldered on a printed-circuit board, the area of the entire printed-circuit board becomes very large which is not suitable to those currently popular products, such as a notebook type computer which usually has very small dimensions.

There are folding printed-circuit boards specially developed to meet the requirements of various kinds of product of small dimensions. These folding printed-circuit boards are characterized by that the entire sheet of them can be folded into an oblong body such that the room occupied by the printed-circuit board in the product can be effectively reduced. However, there is an important problem involved in a folding printed-circuit board, that is, the circuits on two adjacent segments of the folding printed-circuit board must be connected again.

The most common method used in early stage to connect the circuits on two adjacent segments of a folding printed-circuit board is known as "Wire Soldering Method". Please refer to FIG. 1 in which a whole printed-circuit board 10 is folded along three precut lines 11, 12 and 13 to form an oblong body. The circuits on two adjacent segments, for example, segments 14 and 15, are connected by copper wires 16 two ends of which are separately connected to the relevant circuits on the segments 14, 15. The shortcomings of this method are as follows:

1. The soldering of copper wires 16 to the circuits is time-consuming that will inevitably increase the production cost of folding printed-circuit boards.
2. The soldering of such copper wires is difficult and it is very easy for the operator of soldering to touch other circuits during soldering and therefore causes short circuit.
3. Higher percentage of defective product is found after the products are housed with casing and tested, that means a lot of working time and half finished goods are wasted.

There is a soft printed-circuit board developed to cope with the drawbacks existed in the Wire Soldering Method. Tailored pieces of soft printed-circuit board can be pasted and soldered to connect circuits on two adjacent segments of a folding printed-circuit board. This method is time-saving and labour-saving, comparing with the Wire Soldering Method. However, it still takes about twenty minutes to complete the soldering of a normal folding printed-circuit board with this method. Another disadvantages of this method include: 1) the soft printed-circuit board is apt to break; and 2) the circuits tend to be of poor contact.

SUMMARY OF THE INVENTION

It is a primary object of the present invention to provide a method by which bending and soldering corners of a folding printed-circuit board can be efficiently done. In this method, circuits are first drilled at points at where the circuits intersect a joint of two adjacent segments. Then, notches are formed in such manner that they pass the drilled holes on the circuits and extend along the joints of adjacent segments of the printed-circuit board so that the printed-circuit board may be bent to a desired angle at each notch. Fold the notched printed-circuit board to form an oblong body, and then, connect the drilled circuits by soldering the holes on them with adequate amount of tin solder.

BRIEF DESCRIPTION OF THE DRAWINGS

The novelty and other features of the present invention may be best understood through the following detailed description of the preferred embodiment and the accompanying drawings wherein.

DETAILED DESCRIPTION OF THE PREFERRED EMBODIMENTS

Figure 1:
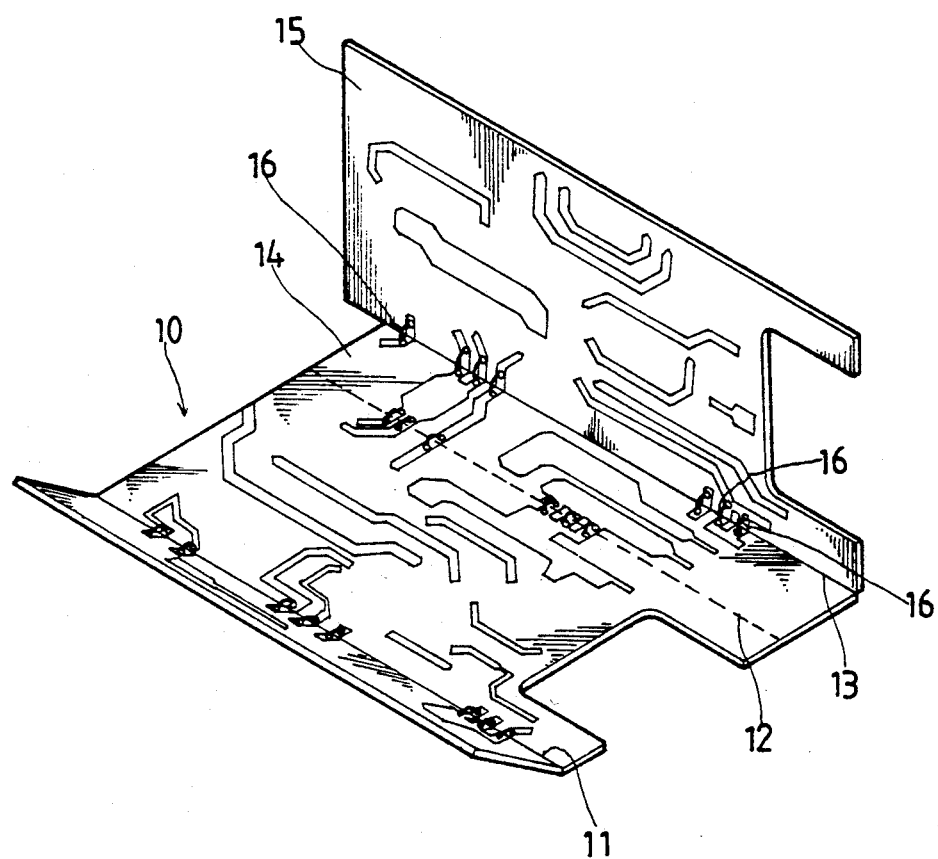
FIG. 1 shows a folding printed-circuit board on which circuits are connected in the conventional manner of Wire Soldering method.
Figure 2:
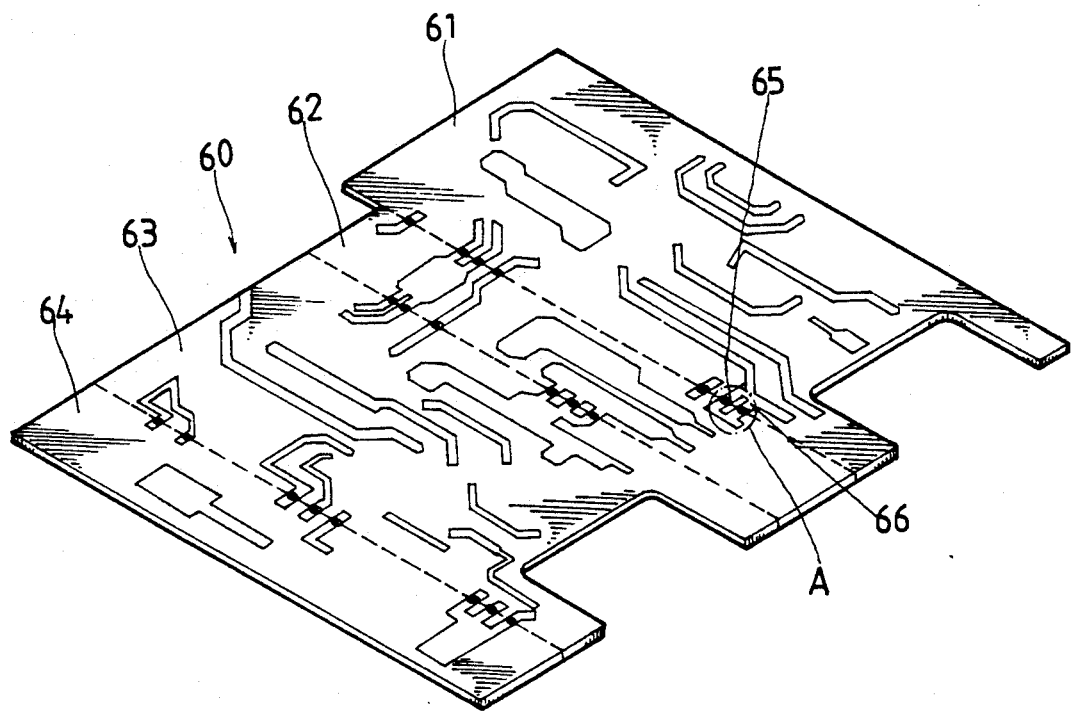
FIG. 2 shows a printed-circuit board which has been drilled and notched according to the method of the present invention at positions to be bent to form an oblong body.
Figure 3:
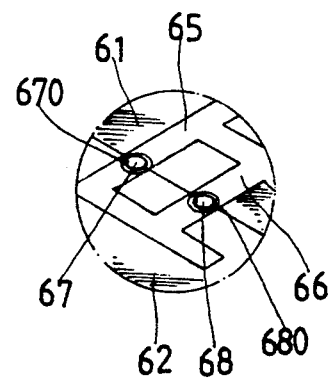
FIG. 3 is a partially enlarged view of the circle A in FIG. 2.

Please refer to FIG. 2. A printed-circuit board 60 having a plurality of circuits thereon is divided into several segments 61, 62, 63, 64 according to a configuration the printed-circuit board 60 is to be folded to form. There are circuits situated at joints of two adjacent segments. Please now refer to FIG. 3. Circuits 65, 66, for example, are just situated at and intersect the joints of segments 61 and 62.

On the circuits 65, 66, holes 67, 68 are separately drilled at points at where the circuits 65, 66 intersect the joint of the adjacent segments 61, 62. The holes 76, 68 are drilled in such manner that they have a circle of copper wall around their inner circumference. Then, notch the joint of the adjacent segments 61, 62 to form a V-shaped groove 69 and allow the groove 69 to pass through the drilled holes 67, 68.

Figure 4:
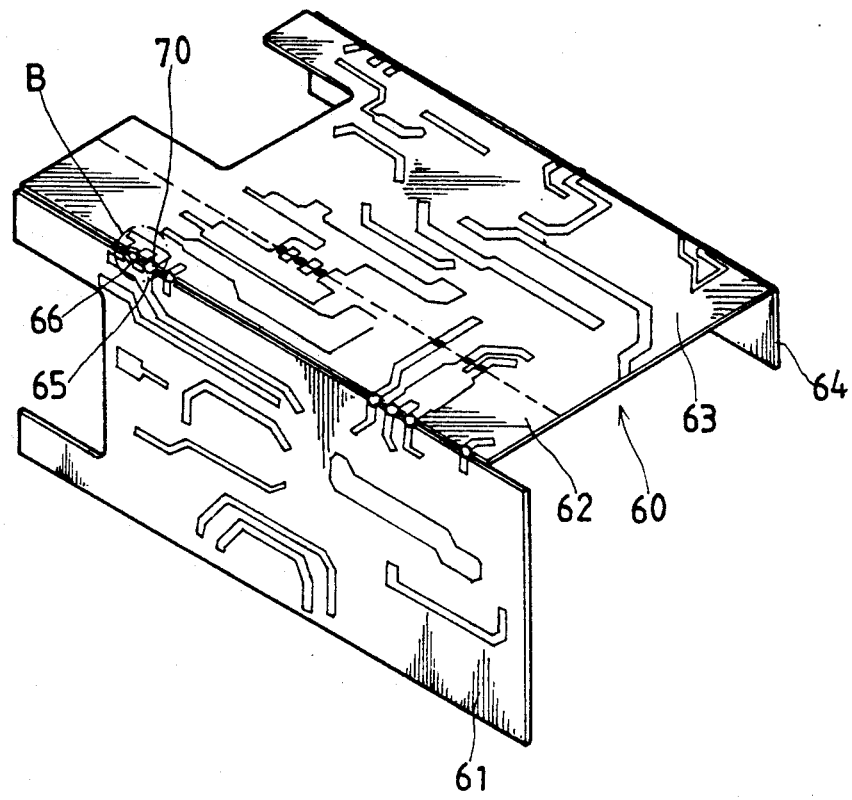
FIG. 4 shows a printed-circuit board which has been folded to form an oblong body after being drilled and notched according to the method of the present invention.
Figure 5:
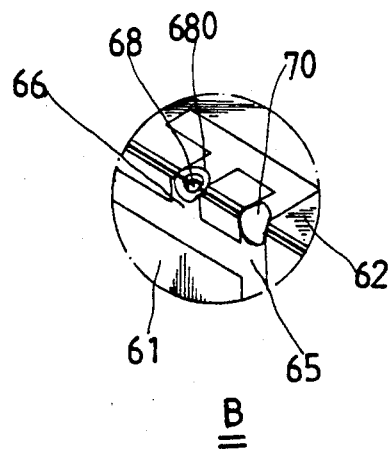
FIG. 5 is a partially enlarged view of the circle B in FIG. 4, showing a hole that has been soldered and another hole that is ready for soldering.

As shown in FIG. 4, the printed-circuit board 60 is bent at each V-shaped groove 69 until every two adjacent segments include a desired angle between them. At this point, use a soldering iron or the like to melt an adequate amount of tin solder 70 in the drilled holes 67, 68, etc., as shown in FIG. 5. By this way,- circuits 65, 66, etc. across every two adjacent segments 61, 62, 63, 64 of the folding printed wiring board 60 can be connected.

Since tin solder 70 may be directly soldered in the drilled holes 67, 68, etc. after the printed-circuit board 60 is folded, it takes only limited time and effort to complete the connection of circuits by soldering. For a similar folding printed-circuit board, only one to two minutes are required to finish the connection of circuits, comparing with the time of 20 minutes required by using the soft printed-circuit board. Considerable benefit can be obtained when the method of bending and soldering a printed-circuit board according to the present invention is employed in a mass production. Furthermore, a printed-circuit board having been folded and soldered in this manner to connect the circuits thereon has high stability of quality and low percentage of defective product that are not found in the folding printed-circuit boards bent and connected with conventional methods.

What is claimed is:

1. A method of bending and soldering corners of a folding printed-circuit board that has a plurality of circuits thereon and is divided into several segments as necessary so that said printed-circuit board may be folded into a three-dimensional body, comprising:

A. drilling holes on said folding printed-circuit board at points at where said circuits intersect joints of two of said segments that are adjacent to each other;
B. cutting said folding printed-circuit board along said joints of adjacent segments and through said drilled holes to form grooves;
C. bending said folding printed-circuit board along said V-shaped grooves; and
D. connecting said circuits that have been drilled by soldering said holes with an adequate-amount of tin solder.

2. A method of bending and soldering corners of a folding printed-circuit board as claimed in claim 1, wherein said grooves are V-shaped cuts.

3. A method of bending and soldering corners of a folding printed-circuit board as claimed in claim 1, wherein said holes are drilled in such manner that they have a circle of copper wall around their inner circumference for soldering after said folding printed-circuit board is bent along each of said joints of said segments.

* * * * *